United States Patent [19]
Kubara et al.

[11] Patent Number: 6,087,714
[45] Date of Patent: Jul. 11, 2000

[54] SEMICONDUCTOR DEVICES HAVING TIN-BASED SOLDER FILM CONTAINING NO LEAD AND PROCESS FOR PRODUCING THE DEVICES

[75] Inventors: Takashi Kubara, Chikushino; Matsuo Masuda, Oita-ken; Tsuyoshi Tokiwa, Nakatsu; Hisahiro Tanaka, Fukuoka, all of Japan

[73] Assignee: Matsushita Electric Industrial Co., Ltd., Osaka, Japan

[21] Appl. No.: 09/298,841

[22] Filed: Apr. 26, 1999

[30]     Foreign Application Priority Data

Apr. 27, 1998  [JP]  Japan ................................. 10-116550
Nov. 26, 1998  [JP]  Japan ................................. 10-335416

[51] Int. Cl.⁷ ......................... H01L 23/495; H01L 23/28; H01L 23/29
[52] U.S. Cl. ......................... 257/666; 257/677; 257/787; 257/793
[58] Field of Search ................................. 257/666, 677, 257/787, 793

[56]     References Cited

U.S. PATENT DOCUMENTS 4,707,724  11/1987  Suzuki et al. ............................ 257/666
5,167,794  12/1992  Ito ............................................ 205/149
5,221,859   6/1993  Kobayashi et al. ..................... 257/676
5,521,432   5/1996  Tsuji et al. ............................. 257/677

FOREIGN PATENT DOCUMENTS 62-287657  12/1987  Japan .................................... 257/666
10102283    4/1998  Japan .

Primary Examiner—David Hardy
Assistant Examiner—Jhihan B Clark
Attorney, Agent, or Firm—Stevens, Davis, Miller & Mosher, L.L.P.

[57]     ABSTRACT

In a lead frame formed out of at least one metal selected from the group consisting of nickel and nickel alloys, copper and copper alloys and iron and iron alloys, the inner lead part is provided with a surface treatment layer of Ag or an alloy containing silver and the outer lead part is provided at least with a surface treatment layer of an alloy containing silver and tin of the body-centered cubic structure preferentially oriented in the (101) plane and/or the (211) plane. According to the above-mentioned structure, a semiconductor device that uses a lead frame for electronic parts which does not contain lead, one of the environmentally harmful pollutants, has good characteristics including solder wettability and bonding strength and is of low cost and a process for producing the device are provided.

6 Claims, 3 Drawing Sheets

FIG. 5A
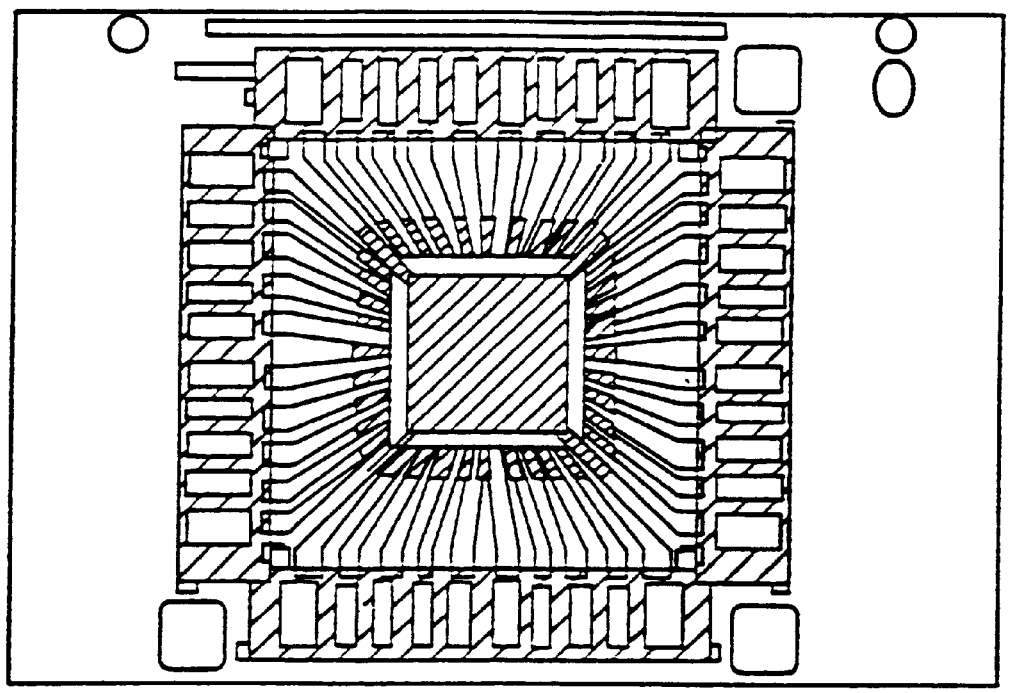
FIG. 5B
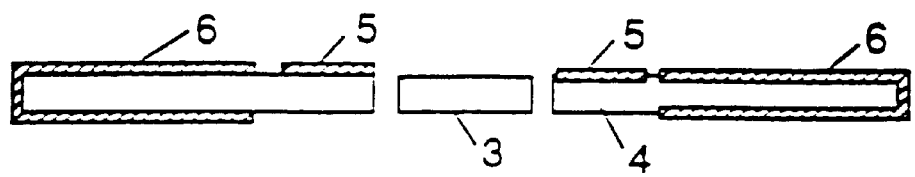
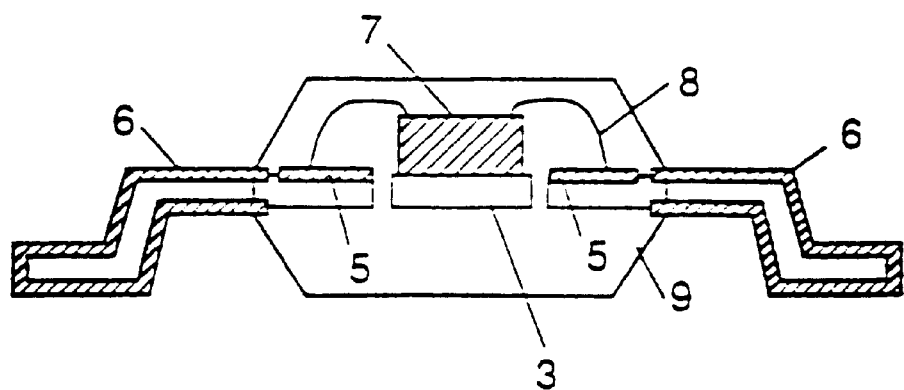
FIG. 5C

SEMICONDUCTOR DEVICES HAVING TIN-BASED SOLDER FILM CONTAINING NO LEAD AND PROCESS FOR PRODUCING THE DEVICES

BACKGROUND OF THE INVENTION

1. Field of the Invention

The present invention relates to a lead frame used in ICs and the like which is formed out of nickel or a nickel alloy, copper or a copper alloy, and iron or an iron alloy. In more particular, it relates to semiconductor devices having tin-based solder film which does not contain lead, one of the environmentally harmful pollutants, and a process for producing the devices.

2. Description of the Related Art

The structure of the lead frame of the prior art is shown in FIGS. 3 and 4. FIGS. 3 and 4 respectively show the plan view and the sectional view of the lead frame of the prior art. In the lead frame of the prior art, the inner lead part 2 to which wire bonding is to be applied is coated with silver plating 5 and the outer lead part 1 is provided with a surface treatment layer containing lead and tin.

In recent years, environmental problems have been attracting much attention. Under the situations, also with regard to the parts used in IC packages, investigations are being made to obtain a usable material which does not contain environmentally harmful substances. Among the materials used in lead frames for electronic parts, one of the materials regarded as particularly harmful to environment is lead used in solder. When allowed to stand, lead will dissolve out into environment and exert a bad influence on a human body, so that, in the electronic industry, efforts are being made to develop lead-free solder, soldering paste, etc. However, no material has yet reached the stage of practical usage which has characteristic properties equal or superior to those of the present-day lead-containing solder. Various attempts have been made with regard to lead frames used for electronic parts. In recent years, lead frames fully plated with palladium to replace lead-containing solder have come to be used in practice. However, when palladium is used singly, on application of heat in the die attaching step or wire bonding step, the wettability of solder tends to deteriorate and the reliability of soldering in surface packaging tends to be insufficient. In recent years, accordingly, products which have thin gold plating as a protective film on the palladium surface have been proposed.

On the other hand, attempts other than the use of palladium are being made at present to form lead-free solder plating by incorporation of such metals as indium, bismuth and zinc in place of lead used in the present-day tin-lead based solder. In the solder alloys and soldering paste used for reflowing, ternary alloys or quaternary alloys which contain, in addition to tin, two or more kinds of metals have been proposed. However, since it is difficult to control the deposition composition of ternary or quaternary alloys in a plating liquor, binary alloys which contain tin and one other metal are currently predominant.

Recently, alloys of tin incorporated with silver have attracted attention as the most promising candidate for lead-free solder, and the plating liquor for such an alloy is being developed. However, the alloy has not yet been used in practice owing to such problems as unsatisfactory appearance, development of cracks caused by bending, discoloration caused by thermal hysteresis and deterioration of solder wettability caused by thermal hysteresis.

BRIEF SUMMARY OF THE INVENTION

The objects of the present invention are to provide a lead frame for electronic parts which does not contain lead, one of the environmentally harmful pollutants, has good characteristic properties including solder wettability and bonding strength and is of low cost, to provide a semiconductor device which uses said lead frame for electronic parts, and to provide a process for producing said lead frame for electronic parts and said semiconductor device.

To attain the above-mentioned objects, the semiconductor device having tin-based solder film which does not contain lead according to the present invention uses a lead frame formed essentially of at least one metal selected from the group consisting of nickel and nickel alloys, copper and copper alloys, and iron and iron alloys wherein an inner lead part of the lead frame is provided with a surface treatment layer of silver or an alloy containing silver and an outer lead part of the lead frame is provided at least with a surface treatment layer of an alloy containing silver and tin of the body-centered cubic structure preferentially oriented in a (101) plane and/or a (211) plane (said surface treatment layer being hereinafter sometimes referred to as the Sn—Ag surface treatment layer). The above-mentioned specific crystal structure of tin can be obtained by regulating the current density at the time of plating. The plating liquor for forming the Sn—Ag surface treatment layer contains as an acid at least one member selected from the group consisting of alkanesulfonic acids, alkanolsulfonic acids and sulfamic acids, as a tin salt at least one member selected from the group consisting of tin alkanesulfonates and SnO, and as a silver salt at least one member selected from the group consisting of silver alkanesulfonates, $Ag_2O$ and AgO. The acid is preferably methanesulfonic acid, hydroxypropane-sulfonic acid or isopropanolsulfonic acid. The tin alkanesulfonate is preferably tin methanesulfonate. The silver alkanesulfonate is preferably silver methanesulfonate. The plating liquor may additionally contain as a stabilizer for silver at least one member selected from the group consisting of sulfur compounds, thioamide compounds and thiol compounds, as a stabilizer for tin at least one member selected from the group consisting of carboxylic acids, sulfamic acids, pyrophosphoric acid salts, phenol compounds and chelating agents, and as a crystallization regulator at least one member selected from the group consisting of aromatic sulfonic acid salts, aliphatic sulfonic acid salts, hydantoin compounds, cysteine compounds, aromatic organic amines, aliphatic aldehydes, aromatic aldehydes, nonionic surfactants, amphoteric surfactants and anionic surfactants. To improve the adhesion of the Sn—Ag surface treatment layer to the base material at the outer lead part, the outer lead part may be treated with at least one treating agent selected from hydrochloric acid, nitric acid and sulfuric acid in advance to the formation of the Sn—Ag surface treatment layer. Further, to improve the surface condition and solder wettability, the Sn—Ag surface treatment layer may be treated with a treating agent containing sodium triphosphate.

The thickness of the Sn—Ag surface treatment layer is preferably selected from the range of 3–15 $\mu$m. The silver content of the Sn—Ag surface treatment layer is selected from the range of 1–8% by weight, whereby the disadvantages of the prior lead frames can be overcome in whole, and there can be provided a lead frame for electronic parts which does not contain lead, one of the environmentally harmful pollutants, has good characteristic properties including solder wettability and bonding strength and is of low cost and a process for producing the lead frame.

BRIEF DESCRIPTION OF THE SEVERAL VIEWS OF THE DRAWINGS

FIGS. 5A–5C is a sectional views of an IC package which uses the lead frame of the present invention.

DETAILED DESCRIPTION OF THE INVENTION

Figure 1:
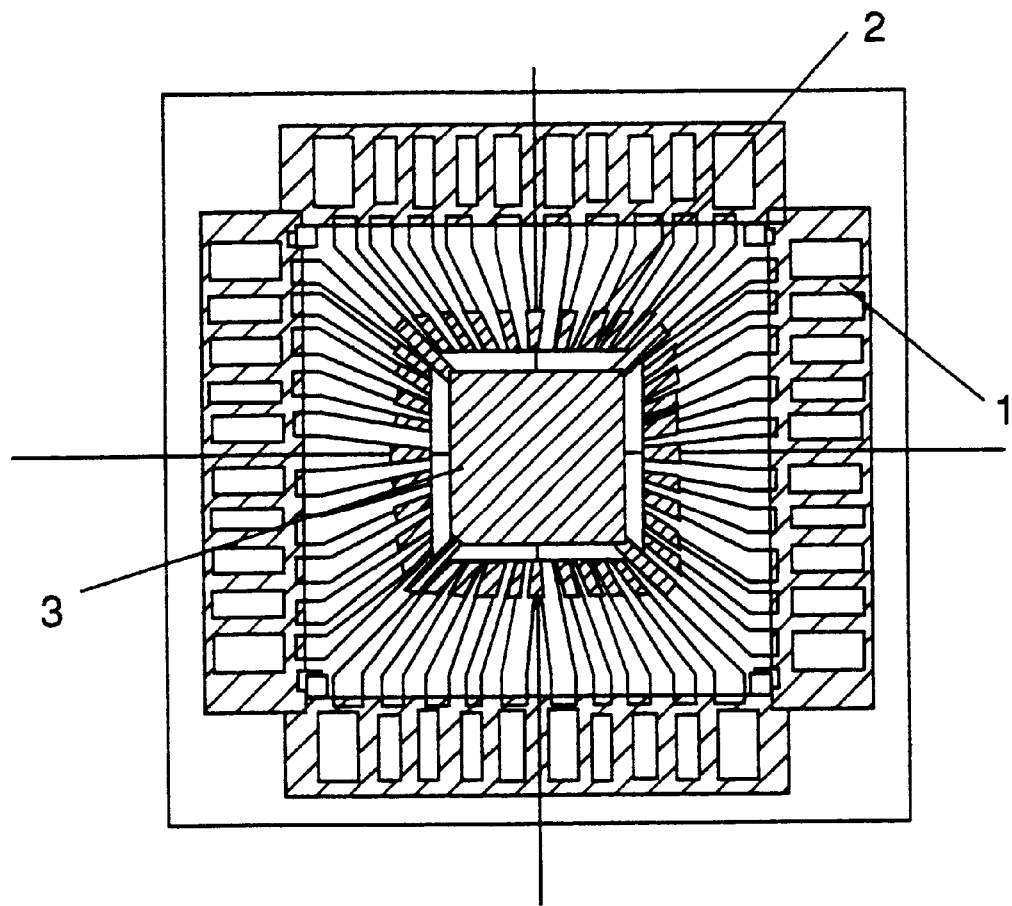
FIG. 1 is a plan view of a lead frame of one embodiment of the present invention.

Some embodiments of the present invention are described below with reference to the drawings. In the drawings, the same member parts as those of the prior examples are respectively indicated by the same reference numerals, and overlapping explanations are omitted.

The plating which does not exert adverse influence on environment used in the present invention employs an alloy of silver and tin of the body-centered cubic structure preferentially oriented in the (101) plane and/or the (211) plane.

In a silver-tin alloy plating, coating films containing tin of the body-centered cubic structure preferentially oriented in the (220) plane can be formed, if desired. In the case of films containing tin of the body-centered structure preferentially oriented in the (220) plane, however, the plating film tends to develop cracks when the outer lead is processed by bending, and the plating film surface is apt to be oxidized due to the heat applied at the time of IC assembling, resulting in discoloration and lowered solder wettability.

The present inventors have made extensive study to overcome the above-mentioned difficulties and resultantly found that tin-silver films containing tin of the body-centered cubic structure preferentially oriented in the (101) plane and/or the (211) plane formed by controlling the crystal orientation prevent the development of cracks and undergo no discoloration and show good solder wettability even after subjected to heating. The tin-silver alloy involves no such problems as limited supply and high cost unlike palladium and shows characteristic properties comparable to those of tin-bismuth, tin-zinc or tin-indium. Though the tin-silver alloy has a higher melting eutectic point of 221° C. than previous tin-lead alloys, it does not need to melt completely to wet when used as plating for the outer lead of a lead frame; it suffices if the alloy reacts with the soldering paste or solder for reflow at their interface at the time of surface packaging and produces a sufficient bonding strength. In fact, the alloy gives a bonding strength and solder wettability comparable to those obtainable by previous lead-containing solder.

Figure 2:
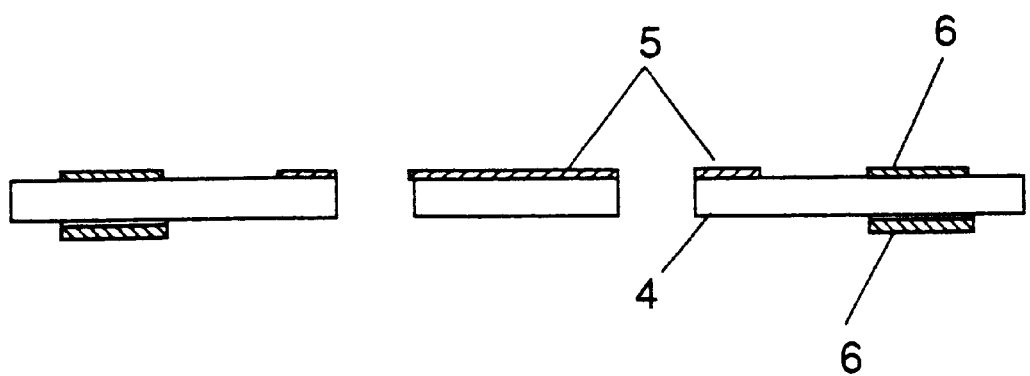
FIG. 2 is a sectional view of a lead frame of one embodiment of the present invention.
Figure 3:
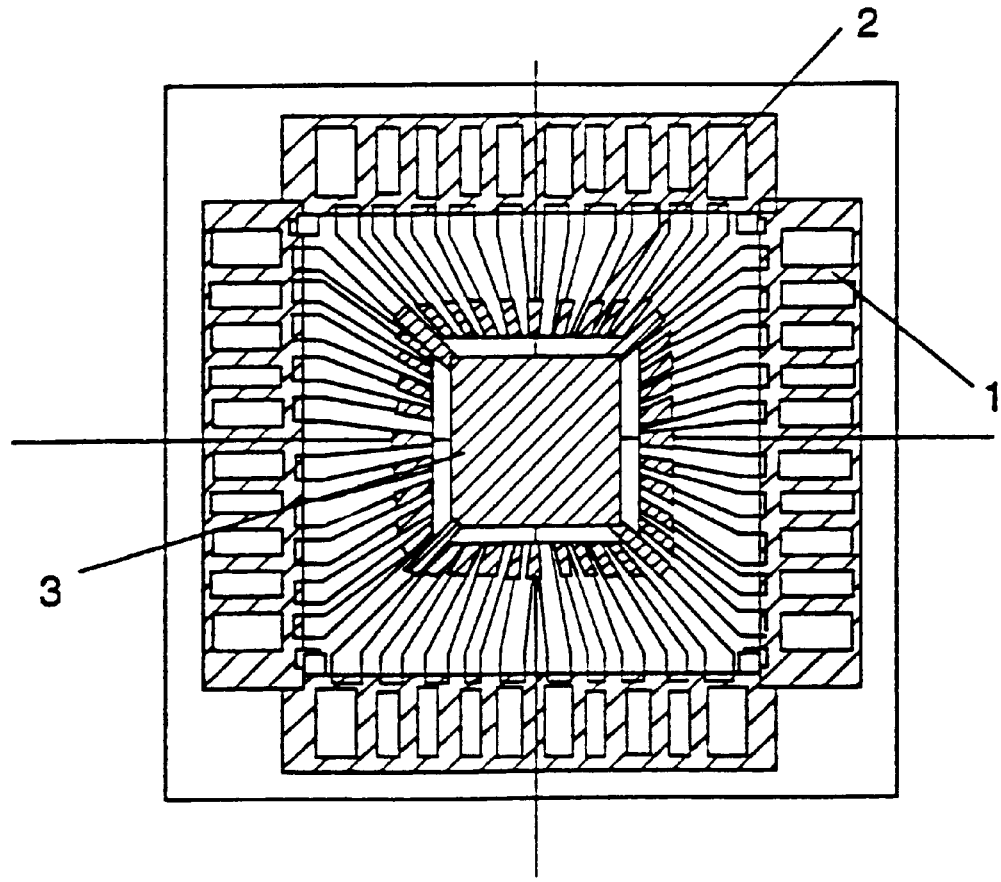
FIG. 3 is a plan view of a lead frame of the prior art.
Figure 4:
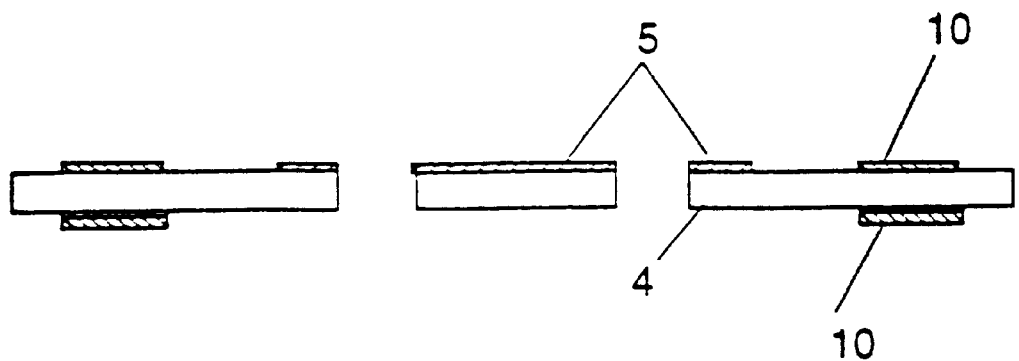
FIG. 4 is a sectional view of a lead frame of the prior art.

FIGS. 1 and 2 are respectively the plan view and the sectional view of the lead frame of the present invention. The inner lead part 2 to which wire bonding is to be applied is provided with a surface treatment layer 5 of silver or an alloy containing silver and the outer lead part 1 is provided with a Sn—Ag surface treatment layer 6 which contains silver and tin of the body-centered cubic structure preferentially oriented in the (101) plane and/or the (211) plane. The surface treatment layer 5 of silver or an alloy containing silver and the Sn—Ag surface treatment layer 6 may either be separated from, or be in contact with each other. The surface treatment layer 5 of silver or an alloy containing silver may be formed on the inner lead part 2 alone, or it may partly cover the pad 3, or it may cover the whole of the pad 3. Though the surface treatment layer 5 of silver or an alloy containing silver and the Sn—Ag surface treatment layer 6 are formed by means of plating in the present embodiment, they can also be formed by such means as physical vapor deposition, sputtering and CVD. In the physical vapor deposition, preferably a direct voltage or an alternating voltage of 50 to 200 V is applied by an ion-plating method. In the sputtering, preferably a bias voltage of 50 to 200 V is applied. In the CVD, preferably a membrane is formed by Sn ions or inert gas ions incident on the surface of the substrate which have an energy of 50 to 200 V. Some preferred embodiments of the present invention are described below.

Embodiment 1

The substrate used for semiconductor lead frames is made by using copper or a copper alloy such as low tin phosphorus bronze and alloy 194, or an iron-nickel alloy called 42 material obtained by adding about 42% by weight of nickel to iron. Fabrication of the substrate into the form of lead frame may be conducted either by a method which comprises coating photosensitive resist on the surface, printing a pattern thereon, followed by developing to leave the photosensitive resist as a positive pattern of the lead frame, and then processing the substrate with an etching solution of ferric chloride, cupric chloride, or the like, or by a method which comprises making a die for punching out the form of the desired lead frame and then subjecting the substrate to a punching operation with a pressing machine by using the die. Both the etching method and the punching method may be adopted as desired in the present invention. After having been worked into the form of a lead frame, the substrate is subjected to a washing treatment and then, if necessary, to a heat treatment step to remove the stress which has remained in the substrate after the punching operation with a press. Thereafter it is subjected to a plating step. The plating step of the present invention is described in detail below.

Through the washing step, oily substances which have sticked to the base material in the pressing step and heat treatment step are removed with an alkaline degreasing agent or the like by the dipping method or the electrical method, used each singly or in combination; thereafter, a copper underlayer plating is formed in a thickness of 0.2 $\mu$m or more. The copper underlayer plating liquor used may be, for example, a copper cyanide solution. Thereafter, the inner lead part 2 is plated with silver through a silver partial plating step. The silver plating liquor used may be, for example, a silver cyanide solution.

After the silver partial plating has been conducted, the outer lead part 1 is pretreated with a treating agent selected from at least one of the hydrochloric acid, nitric acid and sulfuric acid to improve the adhesion between the base material and the Sn—Ag surface treatment layer. The base material surface is etched by the pretreatment, and the adhesion of the surface to the Sn—Ag surface treatment layer is resultantly improved through an anchoring effect.

After the above-mentioned pretreatment, a Sn—Ag surface treatment layer is provided to the outer lead part 1 by partial plating. The plating liquor used for forming the Sn—Ag surface treatment layer contains as an acid at least one member selected from the group consisting of alkanesulfonic acids, alkanosulfonic acids and sulfamic acids, as a tin salt at least one member selected from the group consisting of tin alkane-sulfonates and SnO, and as a silver salt at least one member selected from the group consisting of silver alkanesulfonates, $Ag_2O$ and AgO. The acid is preferably methanesulfonic acid, hydroxypropanesulfonic acid or isopropanolsulfonic acid. The tin alkanesulfonate is preferably tin methanesulfonate. The silver alkane-sulfonate is preferably silver methanesulfonate. The plating liquor preferably contains 50–200 g/l of an acid, 20–60 g/l of tin in terms of metallic tin amount and 0.5–3 g/l of silver in terms of metallic silver amount.

The plating liquor may contain at least one additive which includes as a stabilizer for silver at least one member selected from the group consisting of sulfur compounds, thioamide compounds, thiol compounds and thiosulfuric acid salts, as a stabilizer for tin at least one member selected from the group consisting of carboxylic acids, sulfamic acids, pyrophosphoric acid salts, phenol compounds and chelating agents, as a crystallization regulator at least one member selected from the group consisting of aromatic sulfonic acid salts, aliphatic sulfonic acid salts, hydantoin compounds, cysteine compounds, aromatic organic amines, aliphatic aldehydes, aromatic aldehydes, nonionic surfactants, amphoteric surfactants and anionic surfactants. The preferred amount of the additives to be added may be appropriately determined according to intended objects.

The plating may be conducted, for example, by the jet plating method using a sparger. The temperature of the liquor is preferably 15~35° C., more preferably 25° C. Plating film of good quality can be obtained at current densities in the range of 15–25 A/dm². Current densities over the above-mentioned range causes the increase of (220) plane orientation and resultant deterioration of film quality.

The anode electrode can be selected as desired from insoluble electrodes which comprise at least one member selected from the group consisting of metals and oxides of platinum, iridium, tantalum, rhodium, and ruthenium. If a soluble electrode which uses a solder alloy is employed, the electrode needs to be changed frequently and the production line must be stopped each time, so that the production efficiency becomes very low.

The plating thickness may be selected as desired from the range of 3–15 μm. When the plating thickness is smaller than 3 μm, the solder wettability tends to be poor owing to the influence of the base material. When the thickness is larger than 15 μm problems tend to arise such that the molding resin tends to leak through the gap of the die at the sealing step by the resin. The silver content may be selected as desired in the range of 1–8% by weight. When the silver content is lower than 1% by weight, whiskers of tin tend to develop. When the content is higher than 8% by weight electromigration of silver tends to occur at the time of IC operation.

Then, the exposed part of the initially formed copper underlayer plating onto which the silver plating and Sn—Ag plating have not been applied is removed. Further, to remove the silver which has leaked to the side of the lead, the silver which has leaked onto the frame surface is removed electrically. Thereafter the Sn—Ag treatment layer 6 of the outer lead part 1 is subjected to an etching treatment using a treating agent containing sodium triphosphate or the like to improve solder wettability. Finally the lead frame is immersed in a discoloration preventing agent and then washed with water and dried to obtain a finished product.

Embodiment 2

This embodiment is described with reference to FIGS. 5A–C. An IC chip 7 is dry-fixed to the lead frame according to the present invention shown in FIGS. 1 and 2, and then the lead frame and the IC chip 7 are electrically connected by wire bonding. Then the IC chip 7 is sealed with molding resin 9. While, in the prior art, after the sealing, the oxide layer on the surface of the lead frame is removed and then outer solder plating is applied to the outer lead part 1, the use of the lead frame of the present invention greatly simplifies the production steps.

Embodiment 3

This embodiment is described with reference to FIGS. 5A–C. An IC chip 7 is dry-fixed to a lead frame onto which Ag plating alone has been applied, and then the lead frame and the IC chip 7 are electrically connected by wire bonding.

Then the IC chip 7 is sealed with molding resin 9. After the sealing, the oxide layer of the surface of the lead frame is removed, and outer solder plating of the Sn—Ag surface treatment layer is applied to the outer lead part 1 in the same manner as described in the embodiment 1. Thereafter, the Sn—Ag treatment layer 6 of the outer lead part 1 is treated with a treating agent containing sodium triphosphate to improve solder wettability, and then washed with water and dried to obtain a finished product.

EXAMPLES

Example 1

A 42 material alloy sheet was worked into the form of a lead frame and then subjected to a washing treatment and then, if necessary, to a heat treatment step to remove the stress which had remained in the substrate after the punching operation with a press.

Though the washing step, oily substances which had sticked to the base material in the pressing step and heat treatment step were removed with an alkaline degreasing agent or the like by the dipping method or the electrical method, used each singly or in combination. Thereafter, a copper underlayer plating was formed in a thickness of 0.2 μm or more by using a copper cyanide solution. The inner lead part 2 was plated with silver through a silver partial plating step. The silver plating liquor used was a silver cyanide solution.

Then, the lead frame was treated with a treating agent containing hydrochloric acid at 30° C. for 15 seconds to remove the impurities on the surface and to etch the surface at the same time.

Then, partial plating of a Sn—Ag surface treatment layer was applied to the outer lead part 1 at a current density of 20 ASD (A/dm²). A plating liquor containing SnO, Ag₂O and 150 g/l of methanesulfonic acid was used. The concentration of SnO was 40 g/l in terms of metallic tin and that of Ag₂O was 2 g/l in terms of metallic silver. The above-mentioned plating liquor additionally contained 5 g/l of 2-aminobenzene thiol, 5 g/l of naphthalenesulfonic acid monopolyethylene glycol ether and 80 g/l of bisphenol A dipolyethylene glycol ether.

The plating method used was the jet plating method using a sparger, the flow rate of the plating liquor was 400 l/min and the temperature of the liquor was 25° C. The anode electrode used was an insoluble electrode comprising a titanium base material and a mixture of iridium oxide and tantalum oxide coated thereon. The plating thickness was 8 μm and the silver content of the plating was 2% by weight.

Then, the exposed part of the initially formed copper underlayer plating onto which the silver plating and Sn—Ag plating had not been applied was removed and further, to remove the silver which had leaked to the side of the lead, the silver which had leaked onto the frame surface was removed electrically. Thereafter the Sn—Ag treatment layer of the outer lead part was subjected to an etching treatment by dipping it in a treating agent containing 120 g/l of sodium triphosphate at a liquid temperature of 60° C. for 30 seconds to improve solder wettability. Finally the lead frame was immersed in a discoloration preventing agent, and then washed with water and dried to obtain a finished product.

Upon examining the crystal orientation with an X-ray diffraction apparatus, it was confirmed that the plating obtained was a tin-silver plating layer containing tin of the body-centered cubic structure preferentially oriented in the (101) plane and the (211) plane. The solder wettability was evaluated by using a solder wettability tester (Solder Checker, SWET 100, mfd. by TARUTIN Co., Ltd.) with a tin-lead (H63S) solder at a bath temperature of 230° C. The flux used was R-100-40 (non-halogen type). At the same time, the outer lead part 1 was bent at an angle of 90° to observe the state of peeling of the plating film. Resultantly, the initial zero-cross time, the zero-cross time after heating at 175° C. for 24 hours and the appearance were all good as shown in Table 1.

TABLE 1

|  | Example 1 | Example 2 | Comparative Example 1 | Comparative Example 2 |
|---|---|---|---|---|
| Initial zero-cross | 0.5 sec | 0.45 sec | 0.6 sec | 1.2 sec |
| After-heating zero-cross | 0.65 sec | 0.57 sec | 0.79 sec | 5 sec |
| Bending crack | None | None | Yes | Yes |
| Discoloration | None | None | None | Yes |

Example 2

An alloy 194 sheet was worked into the form of a lead frame and then subjected to a washing treatment and then if necessary, to a heat treatment step to remove the stress which had remained in the substrate after the punching operation with a press.

Then the substrate was subjected to a washing step, copper underlayer plating step and silver partial plating step in the same manner as in Example 1.

After the partial plating of silver had been conducted, a pretreatment was carried out with a treating agent containing 50 g/l of sulfuric acid at 30° C. for 15 seconds. After the pretreatment, partial plating of Sn—Ag was applied to the outer lead part 1 at a current density of 24 ASD (A/dm$^2$). The plating liquor used in the present Example contained 40 g/l, in terms of metallic tin of SnO, 2 g/l, in terms of metallic silver, of AgO, and 150 g/l of methanesulfonic acid and additionally contained as additives 5 g/l of 4,4-aminodiphenyl sulfide, 5 g/l of naphthalenesulfonic acid mono-polyethylene glycol ether and 80 g/l of bisphenol A dipolyethylene glycol ether. The plating was conducted by jet plating using a sparger at a flow rate of plating liquor of 400 l/min and at a plating liquor temperature of 25° C. The anode electrode used was an insoluble electrode comprising a titanium base material and a mixture of iridium oxide and tantalum oxide coated thereon. The Sn—Ag plating had a thickness of 8 μm and a silver content of 2.5%. Then, the exposed part of the initially formed copper underlayer plating onto which the silver plating and Sn—Ag plating had not been applied was removed and further, to remove the silver which had leaked to the side of the lead, the silver which had leaked onto the frame surface was removed electrically. Thereafter the Sn—Ag treatment layer of the outer lead part was subjected to an etching treatment by dipping it in a treating agent containing 120 g/l of sodium triphosphate at a liquid temperature of 60° C. for 30 seconds to improve solder wettability. Finally the lead frame was immersed in a discoloration preventing agent, and then washed with water and dried to obtain a finished product.

Upon examining the crystal orientation with an X-ray diffraction apparatus, it was confirmed that the plating obtained was a tin-silver plating layer containing tin of the body-centered cubic structure preferentially oriented in the (101) plane and the (211) plane. The solder wettability was evaluated under the same conditions as in Example 1. At the same time, the outer lead part 1 was subjected to a bending test to observe the state of peeling. Resultantly, the initial zero-cross time, the zero-cross time after heating at 175° C. for 24 hours and the appearance were all good as shown in Table 1.

Comparative Example 1

The details of the structure of a lead frame for electronic parts formed as a comparative example are described below. A 42-material alloy sheet was worked into the form of a lead frame and then subjected to a washing treatment step and then, if necessary, to a heat treatment step to remove the stress which had remained in the substrate after the punching operation with a press. Then the substrate was subjected to a washing step, copper underlayer plating step and silver partial plating step in the same manner as in Example 1. After the partial plating of silver had been conducted, the outer lead part 1 was subjected, without a pretreatment, to partial plating of Sn—Ag at a current density of 60 ASD (A/dm$^2$). The plating liquor used in the present comparative example contained SnO, AgO and methanesulfonic acid as the base materials. The anode electrode used was an insoluble electrode comprising a titanium base material and a mixture of iridium oxide and tantalum oxide coated thereon. The Sn—Ag plating of the present comparative example had a thickness of 8 μm and a silver content of 2.5%. Then, the exposed part of the initially formed copper underlayer plating onto which the Ag plating and Sn—Ag plating had not been applied was removed and further, to remove the silver which had leaked to the side of the lead, the silver which had leaked onto the frame surface was removed electrically. Thereafter the Sn—Ag treatment layer 6 of the outer lead part 1 was subjected to an etching treatment with a treating agent containing sodium triphosphate to improve solder wettability. Finally the lead frame was immersed in a discoloration preventing agent, and then washed with water and dried to obtain a finished product.

Upon examining the crystal orientation with an X-ray diffraction apparatus, it was confirmed that the plating obtained was a tin-silver layer containing tin of the body-centered cubic structure preferentially oriented in the (220) plane. The solder wettability was evaluated under the same conditions as in Example 1. At the same time, the outer lead part 1 was subjected to a bending test to observe the state of peeling. Resultantly, the initial zero-cross time, the zero-cross time after heating at 175° C. for 24 hours and the appearance were all good as shown in Table 1, but cracks developed in the bending test.

Comparative Example 2

An alloy-194 sheet was worked into the form of a lead frame and then subjected to a washing step and then, if necessary, to a heat treatment step to remove the stress which had remained in the substrate after the punching operation with a press. Then the substrate was subjected to a washing step, copper underlayer plating step and silver partial plating step in the same manner as in Example 1. After the partial plating of silver had been conducted, a pretreatment using a treating agent containing nitric acid was carried out. Thereafter the outer lead part was subjected to partial plating of Sn—Ag. The plating liquor used in the present comparative example contained SnO, AgO and methanesulfonic acid as the base materials. The anode electrode used was an insoluble electrode comprising a titanium base material and a mixture of iridium oxide and tantalum oxide coated thereon. In the present comparative example, a Sn—Ag plating of 8 μm thickness was formed at a current density of 60 ASD (A/dm$^2$). The Sn—Ag plating had a silver content of 2.5%. Then, the exposed part of the initially formed copper underlayer plating onto which the Ag plating and Sn—Ag plating had not been applied was removed and further, to remove the silver which had leaked to the side of the lead, the silver which had leaked onto the frame surface was removed electrically. Thereafter, the Sn—Ag treatment layer 6 of the outer lead part 1 was treated with a treating agent containing sodium triphosphate to improve solder wettability and then, without an etching treatment, the lead frame was immersed in a discoloration preventing agent, and then washed with water and dried to obtain a finished product.

Upon examining the crystal orientation with an X-ray diffraction apparatus, it was confirmed that the plating obtained was a tin-silver layer containing tin of the body-centered cubic structure preferentially oriented in the (220) plane. The solder wettability was evaluated under the same conditions as in Example 1. At the same time, the outer lead part 1 was subjected to a bending test to observe the state of peeling. Resultantly, the initial zero-cross time, the zero-cross time after heating at 175° C. for 24 hours and the appearance were all inferior to those observed in Examples 1 and 2. Cracks developed in the bending test.

Example 3

This Example is described with reference to FIGS. 5A–5C. Onto a lead frame according to the present invention shown in FIGS. 1 and 2 was coated a die attach resin, an IC chip 7 was fixed to the frame and fixed fast by drying in an oven at 200° C. for 2 hours, and then the lead frame and the IC chip 7 were electrically connected by wire bonding. Then the IC chip 7 was sealed with molding resin 9. While, in the prior art, after the sealing, the oxide layer on the surface of the lead frame was removed and then outer solder plating was applied to the outer lead part 1, the use of the lead frame of the present invention simplified the production steps.

Example 4

This Example is described with reference to FIGS. 5A–5C. A die attach resin was coated onto a lead frame to which Ag plating alone had been applied, then an IC chip 7 was fixed to the frame and fixed fast by drying in an oven at 200° C. for 2 hours, and then the lead frame and the IC chip 7 were electrically connected by wire bonding. Then the IC chip 7 was sealed with molding resin 9. After the sealing, the oxide layer on the surface of the lead frame was removed, and then an outer solder plating 8 $\mu$m in thickness was applied to the outer lead part 1 at a current density of 24 ASD (A/dm$^2$). The plating liquor used contained SnO, AgO and methane-sulfonic acid as the base materials. Thereafter the surface treatment layer 6 containing silver and tin of the outer lead part 1 was treated with a treating agent containing sodium triphosphate to improve solder wettability. The resultant device was washed with water and dried to obtain a finished product. Upon examining the crystal orientation with an X-ray diffraction apparatus, it was confirmed that the tin in the plating layer obtained was of the body-centered cubic structure preferentially oriented in the (101) plane and the (211) plane.

What is claimed is:

1. A semiconductor device which uses a lead frame formed out of at least one metal selected from the group consisting of nickel and nickel alloys, copper and copper alloys, and iron and iron alloys wherein an inner lead part of the lead frame is provided with a surface treatment layer of silver or an alloy containing silver and an outer lead part of the lead frame is provided at least with a Sn—Ag surface treatment layer of an alloy containing silver and tin of the body-centered cubic structure preferentially oriented in a (101) plane and/or a (211) plane.

2. A semiconductor device according to claim 1 wherein the Sn—Ag surface treatment layer of the outer lead part is formed from a plating liquor which contains as an acid at least one member selected from the group consisting of alkanesulfonic acids, alkanolsulfonic acids and sulfamic acids, as a tin salt at least one member selected from the group consisting of tin alkane-sulfonates and SnO and as a silver salt at least one member selected from the group consisting of silver alkanesulfonates, Ag$_2$O and AgO.

3. A semiconductor device according to claim 1 wherein the Sn—Ag surface treatment layer has a thickness of 3–15 $\mu$m.

4. A semiconductor device according to claim 1 wherein the Sn—Ag surface treatment layer has a silver content of 1–8% by weight.

5. A semiconductor device which is formed by using the lead frame for electronic parts according to claim 1 which contains the Sn—Ag surface treatment layer of the outer lead part that contains silver and tin of the body-centered cubic structure preferentially oriented in the (101) plane and the (211) plane.

6. A semiconductor device according to claim 2 wherein the plating liquor further contains as a stabilizer for silver at least one member selected from the group consisting of sulfur compounds, thioamide compounds and thiol compounds, as a stabilizer for tin at least one member selected from the group consisting of carboxylic acids, sulfamic acids, pyrophosphoric acid salts, phenol compounds and chelating agents, and as a crystallization regulator at least one member selected from the group consisting of aromatic sulfonic acid salts, aliphatic sulfonic acid salts, hydantoin compounds, cysteine compounds, aromatic organic amines, aliphatic aldehydes, aromatic aldehydes, nonionic surfactants, amphoteric surfactants and anionic surfactants.

* * * * *